(12) United States Patent
Ogawa et al.

(10) Patent No.: US 9,978,515 B2
(45) Date of Patent: May 22, 2018

(54) ELECTRONIC COMPONENT UNIT AND MANUFACTURING METHOD THEREFOR

(71) Applicant: Murata Manufacturing Co., Ltd., Nagaokakyo-shi, Kyoto-fu (JP)

(72) Inventors: Kazuto Ogawa, Nagaokakyo (JP); Isao Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 393 days.

(21) Appl. No.: 14/568,446

(22) Filed: Dec. 12, 2014

(65) Prior Publication Data
US 2015/0096792 A1  Apr. 9, 2015

Related U.S. Application Data

(63) Continuation of application No. PCT/JP2013/063979, filed on May 20, 2013.

(30) Foreign Application Priority Data

Jun. 14, 2012  (JP) .................................. 2012-134718

(51) Int. Cl.
H05K 7/00  (2006.01)
H05K 1/16  (2006.01)
(Continued)

(52) U.S. Cl.
CPC .............. *H01G 2/065* (2013.01); *H01G 2/06* (2013.01); *H01G 4/12* (2013.01); *H01G 4/30* (2013.01);
(Continued)

(58) Field of Classification Search
CPC ... H05K 2201/049; H05K 2201/10378; H05K 1/141; H05K 1/181; H05K 3/3442;
(Continued)

(56) References Cited

U.S. PATENT DOCUMENTS 5,573,172 A * 11/1996 Gore ......................... 228/180.22
6,252,305 B1 * 6/2001 Lin et al. ....................... 257/777
(Continued)

FOREIGN PATENT DOCUMENTS

JP  07111380 A *  4/1995  ............... H05K 1/18
JP  11-168149 A   6/1999
(Continued)

OTHER PUBLICATIONS

Original Japanese and English Translation of Makino (07111380A) provided with Office Action.*
(Continued)

*Primary Examiner* — Chau N Nguyen
*Assistant Examiner* — Roshn Varghese
(74) *Attorney, Agent, or Firm* — Keating & Bennett, LLP

(57) ABSTRACT

An electronic component unit includes a substrate including principal surfaces opposing each other and side surfaces between the principal surfaces, and components mounted on the principal surface of the substrate. The side surfaces include first side surfaces formed before the components are mounted and second side surfaces formed after the components are mounted. As viewed from a line normal to the principal surface of the substrate, distances between the first side surfaces and the components are different from distances between the second side surfaces and the components.

16 Claims, 7 Drawing Sheets

(51) Int. Cl.
    *H01G 2/06*     (2006.01)
    *H05K 1/11*     (2006.01)
    *H01G 4/12*     (2006.01)
    *H01G 4/30*     (2006.01)
    *H05K 1/18*     (2006.01)
    *H05K 3/30*     (2006.01)
    *H05K 3/00*     (2006.01)

(52) U.S. Cl.
    CPC ............ *H05K 1/111* (2013.01); *H05K 1/181* (2013.01); *H05K 3/303* (2013.01); *H05K 3/0052* (2013.01); *H05K 3/0097* (2013.01); *H05K 2201/09063* (2013.01); *H05K 2201/09227* (2013.01); *H05K 2201/10015* (2013.01); *H05K 2201/2045* (2013.01); *Y02P 70/611* (2015.11); *Y10T 29/4913* (2015.01)

(58) Field of Classification Search
    CPC ........ H05K 1/0231; H05K 1/16; H05K 1/162; H05K 2201/10015; H05K 2201/10636; H01L 2225/06513; H01L 2225/06517; H01L 2225/0652
    USPC .......................................................... 361/763
    See application file for complete search history.

(56) References Cited

U.S. PATENT DOCUMENTS

| | | | |
|---|---|---|---|
| 6,930,378 B1* | 8/2005 | St Amand et al. | 257/686 |
| 7,063,797 B2* | 6/2006 | Laffoley | 216/17 |
| 2003/0137042 A1* | 7/2003 | Mess et al. | 257/686 |
| 2004/0066589 A1 | 4/2004 | Togashi et al. | |
| 2004/0150088 A1* | 8/2004 | Corisis | H01L 23/13 |
| | | | 257/684 |
| 2013/0015571 A1* | 1/2013 | Chun | 257/737 |

FOREIGN PATENT DOCUMENTS

| | | | |
|---|---|---|---|
| JP | 2004-134430 A | 4/2004 | |
| JP | 2004335657 A * | 11/2004 | ............... H05K 3/34 |
| JP | 2005-051167 A | 2/2005 | |
| WO | 2012/090986 A1 | 7/2012 | |

OTHER PUBLICATIONS

Original Japanese and English Translation of Sato (2004335657A) provided with Office Action.*
English Translation of Katsumata (JP11-168149) provided with Office Action.*
Official Communication issued in International Patent Application No. PCT/JP2013/063979, dated Jun. 18, 2013.

* cited by examiner

ELECTRONIC COMPONENT UNIT AND MANUFACTURING METHOD THEREFOR

BACKGROUND OF THE INVENTION

1. Field of the Invention

The present invention relates to an electronic component unit and a manufacturing method therefor, and more particularly, to an electronic component unit including a component mounted on a substrate and to a manufacturing method for such an electronic component unit.

2. Description of the Related Art

Hitherto, various electronic component units including components mounted on substrates have been proposed.

For example, in an interposer capacitor 101 shown in a plan view of FIG. 12, a multilayer capacitor 102 is mounted on an interposer substrate 120. The interposer substrate 120 has the function of reducing vibration which may be conducted to, for example, a circuit board on which the interposer capacitor 101 is mounted, by absorbing vibration generated in the multilayer capacitor 102 due to the application of an AC voltage.

By using an aggregate substrate including individual substrate regions to be divided as a plurality of individual substrates, electronic component units including components mounted on substrates can be efficiently manufactured. Generally, after components are mounted on individual substrate regions of an aggregate substrate, the aggregate substrate is cut along the individual substrate regions into individual substrates having the components mounted thereon, that is, into electronic component units.

For example, multilayer capacitors are mounted on individual substrate regions, which will be used for interposer substrates, of an aggregate substrate, and then, by dicing processing, the aggregate substrate is cut into individual substrates having the multilayer capacitors mounted thereon, that is, into interposer capacitors. When multilayer capacitors are mounted on an aggregate substrate by, for example, soldering, and then, the aggregate substrate is divided by dicing, a distance with an extra allowance is required between the mounted multilayer capacitors and cut surfaces of the aggregate substrate, that is, between the mounted multilayer capacitors and side surfaces of individual substrates, by considering the positional precision in dicing (variation in the cut positions).

As shown in FIG. 12, when the distances between the multilayer capacitor 102 and the side surfaces of the interposer substrate are substantially uniform all along the multilayer capacitor 102, it is possible to minimize the area required for mounting the interposer capacitor 101.

However, since the distances between the side surfaces of a substrate and a component are determined by the positional precision in dicing, they are uniform regardless of the size of a component to be mounted. Thus, even if the size of a component to be mounted is reduced, there is a limitation on reducing the size of an electronic component unit including such a component mounted on a substrate.

SUMMARY OF THE INVENTION

Preferred embodiments of the present invention provide an electronic component unit that is reduced to a smaller size and a manufacturing method therefor.

An electronic component unit according to a preferred embodiment of the present invention includes a substrate including a pair of principal surfaces opposing each other and side surfaces connecting between the principal surfaces, and a component mounted on the principal surface of the substrate. The side surfaces of the substrate include (i) a first side surface formed before the component is mounted and (ii) a second side surface formed after the component is mounted. As viewed from a line normal to the principal surfaces of the substrate, a distance between the first side surface and the component is different from a distance between the second side surface and the component.

With this configuration, when forming the second side surface after the component is mounted, a distance with an extra allowance is required between the second side surface and the component by considering the positional precision of the second side surface, that is, a variation in the forming position of the second side surface.

In contrast, such an extra allowance is not required for a distance between the component and the first side surface formed prior to the mounting of the component. It is not necessary that the distance between the first side surface and the component be the same as the distance between the second side surface and the component. Accordingly, the distance between the first side surface and the component can be suitably selected so as to reduce the size of the electronic component unit.

That is, by setting the distance between the first side surface and the component to be different from the distance between the second side surface and the component, the size of the electronic component unit including the component on the substrate is significantly reduced.

In one preferred aspect of various preferred embodiments of the present invention, as viewed from a line normal to the principal surfaces of the substrate, the component may be disposed inward of the substrate, and the distance between the first side surface and the component preferably is smaller than the distance between the second side surface and the component.

In this manner, by disposing the component as close as possible to the first side surface, the size of the electronic component unit is significantly reduced.

In another preferred aspect of various preferred embodiments of the present invention, as viewed from a line normal to the principal surfaces of the substrate, the component preferably extends beyond the first side surface and extends to outside of the substrate.

In the direction in which the component passes beyond the first side surface and extends to outside of the substrate, the dimension of the substrate is significantly reduced, thus making it possible to reduce the size of the electronic component unit.

Preferably, the principal surfaces of the substrate has a rectangular or substantially rectangular shape. The side surfaces of the substrate may include (i) a pair of the first side surfaces opposing each other and (ii) a pair of the second side surfaces opposing each other. As viewed from a line normal to the principal surfaces of the substrate, the component preferably extends beyond the pair of first side surfaces and preferably extends to outside of both side portions of the substrate.

Concerning the direction in which the pair of first side surfaces oppose each other, the dimension of the substrate preferably is reduced to be smaller than the electronic component unit. It is thus possible to significantly reduce or minimize the dimension of the electronic component unit in the direction in which the pair of first side surfaces oppose each other.

Preferably, as viewed from a line normal to the principal surfaces of the substrate, recessed portions positioned farther backward than the pair of second side surfaces are preferably provided in the substrate, and the component may be disposed in such a manner as to overlap spaces defined by the recessed portions.

The substrate in which recessed portions are provided in the pair of second side surfaces is reduced to as small as possible in the direction in which the pair of second side surfaces oppose each other, thus making it possible to reduce the size of the electronic component unit.

Preferred embodiments of the present invention also provide a manufacturing method for an electronic component unit configured as follows.

A manufacturing method for an electronic component unit according to a preferred embodiment of the present invention includes (a) a substrate preparing step of preparing an aggregate substrate including a pair of principal surfaces opposing each other and including individual substrate regions to be divided as individual substrates; (b) a component mounting step of mounting a component on the individual substrate regions of the aggregate substrate; and (c) a substrate dividing step of dividing the aggregate substrate into the individual substrates by forming division grooves in the aggregate substrate along boundary lines of the individual substrate regions. The manufacturing method for an electronic component unit is a method for manufacturing an electronic component unit including the component mounted on the divided individual substrate. By forming the division grooves in the aggregate substrate along at least one side of each of the individual substrate regions prior to the component mounting step, the substrate dividing step is started prior to the component mounting step.

According to the above-described method, when mounting a component in the component mounting step, the distance between the division grooves that have already been formed and the component is narrowed. Thus, it is possible to significantly reduce the size of the electronic component unit.

When forming side surfaces after a component has been mounted, a distance with an extra allowance is required between the side surfaces and the component. The reason for this is to avoid an adverse influence, such as the interference of a dicing blade with a component when forming side surfaces or to consider the precision (variation) of the positions at which side surfaces are formed. In contrast, such an extra allowance is not required for a distance between the component and side surfaces that have been formed before the component is mounted.

The division grooves may pass through the principal surfaces of the aggregate substrate, or they may not pass through the principal surfaces. If the division grooves do not pass through the principal surfaces of the aggregate substrate, force may be applied along the division grooves so as to divide the aggregate substrate into the individual substrates.

Preferably, the aggregate substrate may include (a) a first zone including one or some of the individual substrate regions, (b) a second zone including another one or other some of the individual substrate regions, and (c) a third zone disposed between the first zone and the second zone. The division grooves formed along the boundary lines of the individual substrate regions in the first zone and the division grooves formed along the boundary lines of the individual substrate regions in the second zone may be disconnected in the third zone.

By intermittently forming division grooves, the strength of the aggregate substrate is less decreased than that in a case in which division grooves are continuously formed. That is, by forming the division grooves separately in the first zone and the second zone, the strength of the aggregate substrate is less decreased than that in a case in which division grooves are formed also in the third zone so as to form common division grooves continuously from the first zone to the second zone via the third zone.

Preferably, prior to the component mounting step, the division grooves passing through the principal surfaces of the aggregate substrate may be formed along all of the boundary lines of the individual substrate regions while the aggregate substrate is being temporarily fixed so as to divide the aggregate substrate into the individual substrates which are being temporarily fixed, thus completing the substrate dividing step prior to the component mounting step. In the component mounting step, the component may be mounted on the individual substrates which are being temporarily fixed.

Since the substrate dividing step is completed prior to the component mounting step, the number of steps of this manufacturing method is the same as that of a general manufacturing method in which a component is first mounted on an aggregate substrate, and then, the aggregate substrate is divided into individual substrates.

According to various preferred embodiments of the present invention, the distances between side surfaces of a substrate and a component are significantly reduced to be smaller, thus making it possible to reduce the size of an electronic component unit including the component mounted on the substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to FIGS. 1 through 11.

First Preferred Embodiment

An electronic component unit 20 according to a first preferred embodiment of the present invention will be described below with reference to FIGS. 1 through 4.

Figure 1:
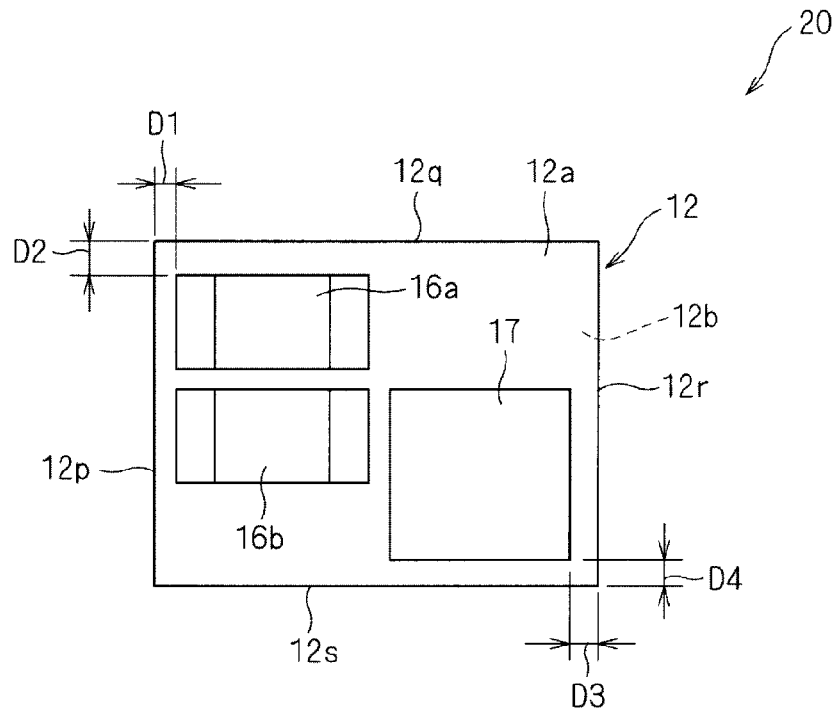
FIG. 1 is a plan view of an electronic component unit according to first and second preferred embodiments of the present invention.

FIG. 1 is a plan view of the electronic component unit 20. As shown in FIG. 1, in the electronic component unit 20, components 16a, 16b, and 17 are mounted on a substrate 12.

The substrate 12 includes a pair of rectangular or substantially rectangular principal surfaces 12a and 12b opposing each other and side surfaces 12p through 12s connecting between the principal surfaces 12a and 12b. As the substrate 12, a printed board using phenolic paper or glass epoxy resin, a flexible board using polyimide, liquid crystal polymer, or polyester, or a ceramic board may preferably be used.

The components 16a, 16b, and 17 to be mounted are chip components 16a and 16b, such as a chip capacitor, for example, a multilayer ceramic capacitor, a chip resistor, a chip coil, a chip vibrator, a chip protection element, and a filter, and an IC chip 17, such as a wireless LAN module chip.

The chip components 16a and 16b are soldered to terminal electrodes (not shown) disposed on one principal surface 12a of the substrate 12, while the IC chip 17 is flip-chip-mounted. In FIG. 1, solder is not shown. On the other principal surface 12b of the substrate 12, a connecting electrode (not shown) to mount the electronic component unit 20 is provided.

As shown in FIG. 1, as viewed from a line normal to the principal surface 12a of the substrate 12 (in a direction perpendicular to the plane of the drawing), the components 16a, 16b, and 17 are disposed inward of the substrate 12 such that they are separated from the side surfaces 12p through 12s of the substrate 12 with distances D1 through D4 therebetween.

Figure 2:
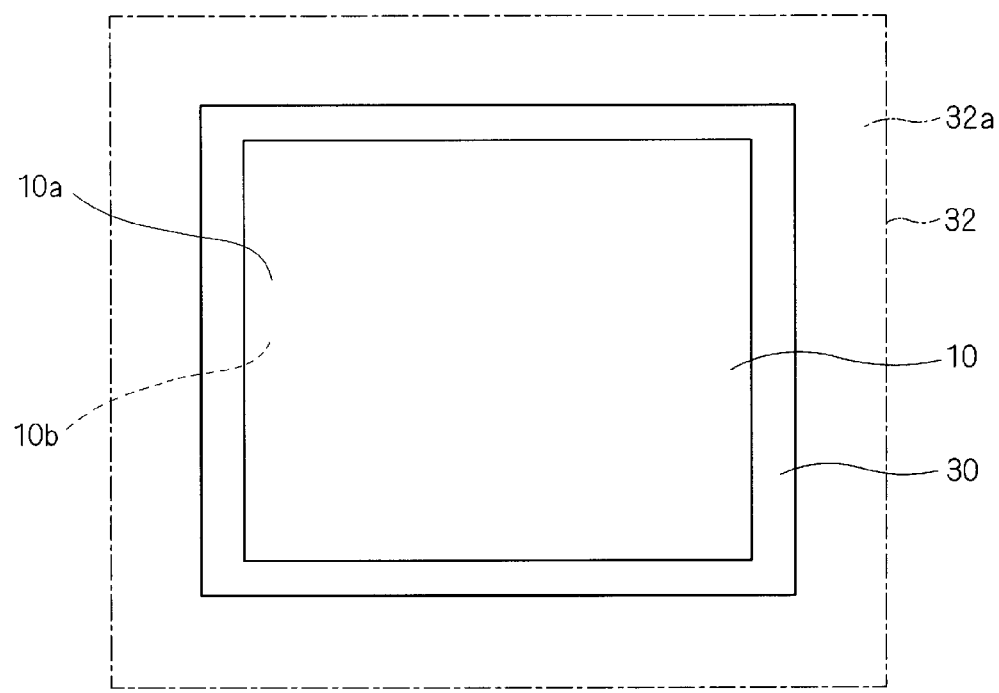
FIG. 2 is a plan view illustrating a manufacturing step for electronic component units according to the first preferred embodiment of the present invention.
Figure 3:
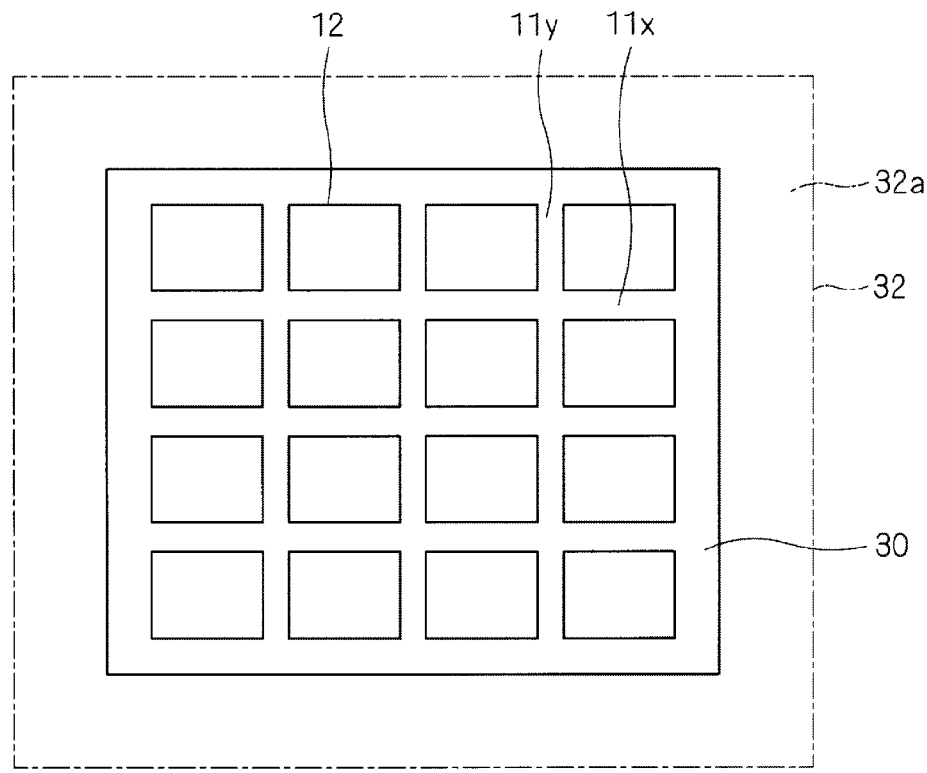
FIG. 3 is a plan view illustrating a manufacturing step for electronic component units according to the first preferred embodiment of the present invention.
Figure 4:
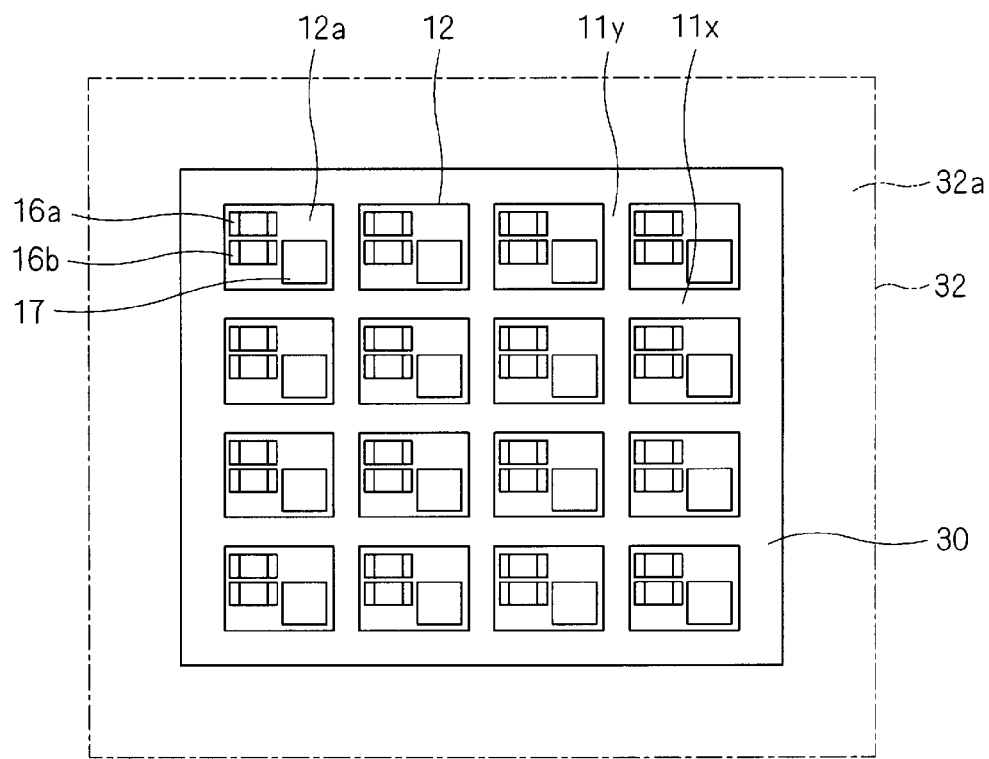
FIG. 4 is a plan view illustrating a manufacturing step for electronic component units according to the first preferred embodiment of the present invention.

A non-limiting example of a manufacturing method for the electronic component unit 20 will now be described below with reference to FIGS. 2 through 4. FIGS. 2 through 4 are plan views schematically illustrating manufacturing steps for the electronic component unit 20.

First, as shown in FIG. 2, an aggregate substrate 10 is prepared and is temporarily fixed. The aggregate substrate 10 includes a pair of principal surfaces 10a and 10b opposing each other. One principal surface 10b of the aggregate substrate 10 is temporarily fixed to a plane 32a of a jig 32 by using adhesive tape 30. The aggregate substrate 10 may be temporarily fixed by using a suitable method, for example, by using adhesive or by vacuum suction through an opening provided in the plane 32a of the jig 32.

Then, as shown in FIG. 3, in the temporarily fixed aggregate substrate 10, division grooves 11x and 11y passing through the principal surfaces 10a and 10b of the aggregate substrate 10 are formed in a lattice-shaped configuration by using a suitable method, such as dicing processing or laser processing, and then, so as to divide the aggregate substrate 10 into individual substrates 12. That is, the aggregate substrate includes individual substrate regions which will be used as the individual substrates 12 and also includes cutting allowances reserved for forming the division grooves 11x and 11y along the boundary lines of the individual substrate regions. The divided individual substrates 12 remain temporarily fixed on the base 32.

Then, as shown in FIG. 4, the components 16a, 16b, and are mounted on the principal surface 12a of each of the temporarily fixed individual substrates 12. More specifically, the chip components 16a and 16b are reflow-soldered, while the bump-treated IC chip 17 is flip-chip-mounted. In FIG. 4, solder is not shown.

If necessary, a resin mold is formed or a casing is attached while the individual substrates 12 remain temporarily fixed. Then, the temporal fixing state of the individual substrates 12 is released, thus removing the electronic component units 20.

In the above-described manufacturing method, the division grooves 11x and 11y have already been formed when the components 16a, 16b, and 17 are mounted on the individual substrates 12. Accordingly, as shown in FIG. 1, the distances D1 through D4 between the components 16a, 16b, and 17 and the side surfaces 12p through 12s of the individual substrates 12 formed by the division grooves 11x and 11y are reduced to be smaller than those by using a general manufacturing method in which components are first mounted on an aggregate substrate, and then, the aggregate substrate is divided into individual substrates. That is, the size of the substrate 12 is reduced to be smaller than that by using a general manufacturing method. As a result, it is possible to reduce the size of the electronic component unit 20.

Even if the positional displacement occurs unexpectedly when mounting the component 16a, 16b, or 17 in the component mounting step, the displaced component 16a, 16b, or 17, in particular, an expensive IC chip 17 does not have to be cut off, since the substrate dividing step has already been completed.

The substrate dividing step of dividing the aggregate substrate 10 into the individual substrates 12 by forming the division grooves 11x and 11y in the aggregate substrate 10 has already been completed prior to the component mounting step of mounting the components 16a, 16b, and 17. Accordingly, the number of steps of this manufacturing method is the same as that of a general manufacturing method in which components are first mounted on an aggregate substrate, and then, the aggregate substrate is divided into individual substrates. Thus, this manufacturing method requires no more time and effort than the general manufacturing method.

Second Preferred Embodiment

A non-limiting example of a manufacturing method for the electronic component unit 20 according to a second preferred embodiment of the present invention will be discussed below with reference to FIGS. 1 and 5 through 8.

In the second preferred embodiment, the electronic component unit 20 having the same configuration as the first preferred embodiment shown in FIG. 1 is fabricated by using a manufacturing method different from that of the first preferred embodiment, as shown in FIGS. 5 through 8. FIGS. 5 through 8 are plan views schematically illustrating manufacturing steps for the electronic component unit 20.

Figure 5:
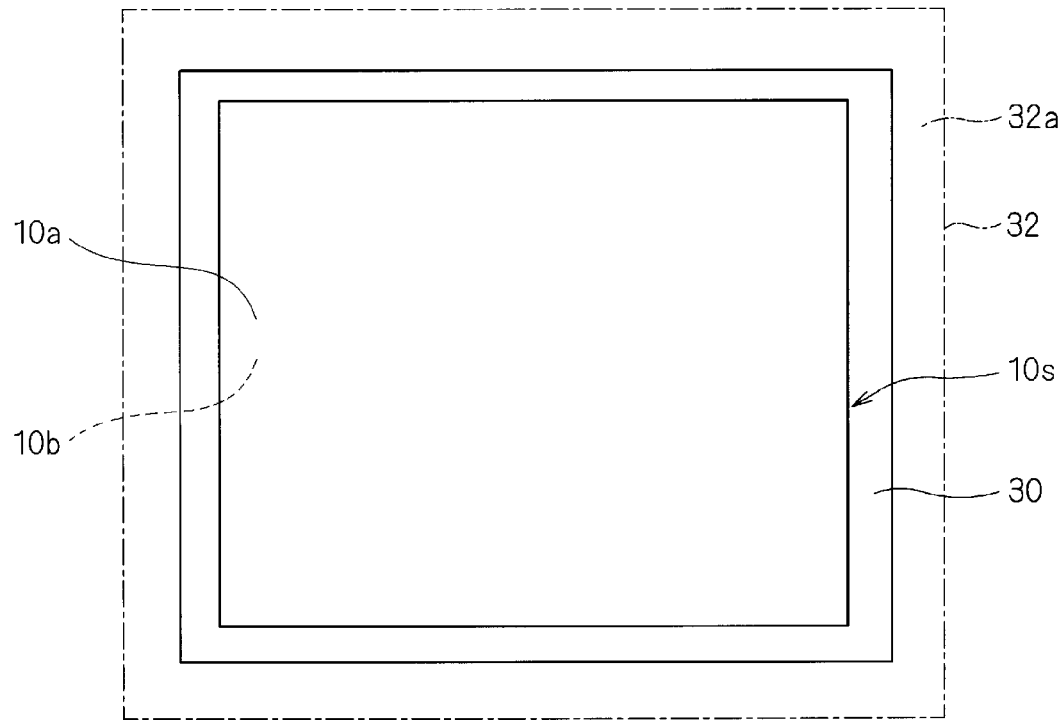
FIG. 5 is a plan view illustrating a manufacturing step for electronic component units according to the second preferred embodiment of the present invention.

First, as shown in FIG. 5, an aggregate substrate 10s is prepared and is temporarily fixed. The aggregate substrate 10s includes a pair of principal surfaces 10a and 10b opposing each other. One principal surface 10b of the aggregate substrate 10s is temporarily fixed to a plane 32a of a jig 32 by using adhesive tape 30. The aggregate substrate 10s may be temporarily fixed by using a suitable method, for example, by using adhesive or by vacuum suction through an opening provided in the plane 32a of the jig 32.

Figure 6:
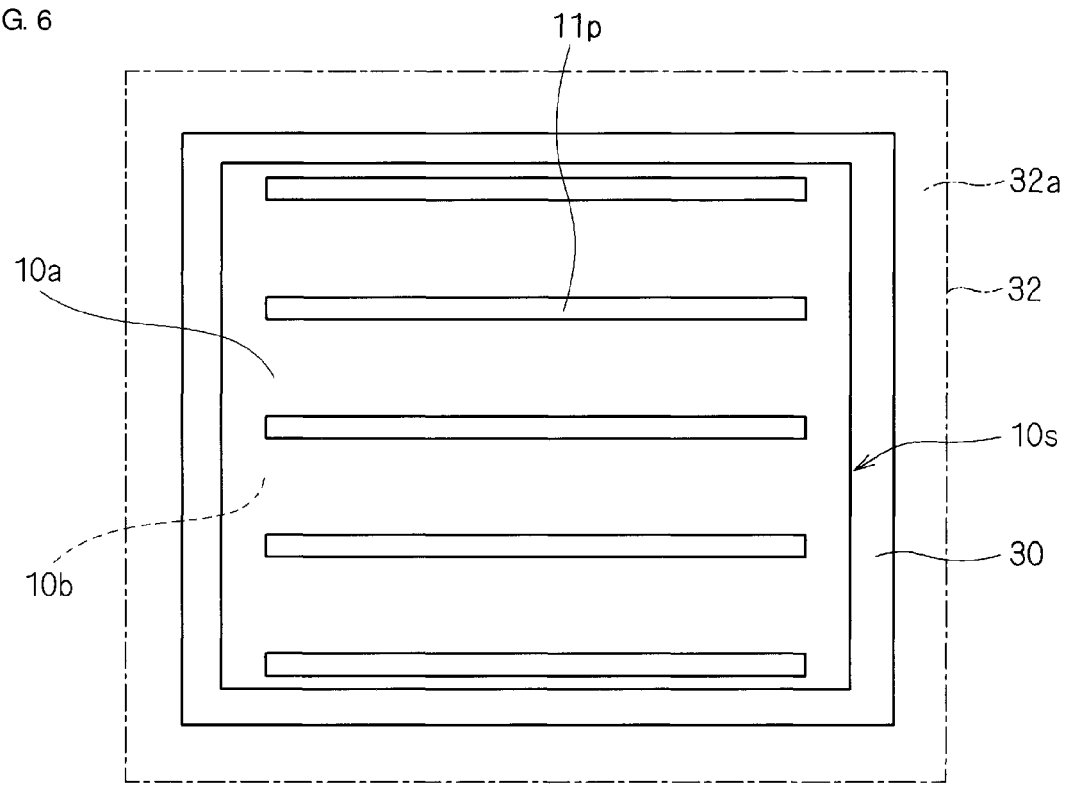
FIG. 6 is a plan view illustrating a manufacturing step for electronic component units according to the second preferred embodiment of the present invention.

Then, as shown in FIG. 6, among division grooves 11p and 11q (see FIG. 8 for division grooves 11q) arranged in two directions for dividing the aggregate substrate 10s into individual substrates 12 in a lattice-shaped configuration, division grooves 11p only in one direction (horizontal direction in the drawing) are formed in the temporarily fixed aggregate substrate 10s by using a suitable method, such as dicing processing or laser processing. The division grooves 11p are formed such that they pass through the principal surfaces 10a and 10b of the aggregate substrate 10s.

Figure 7:
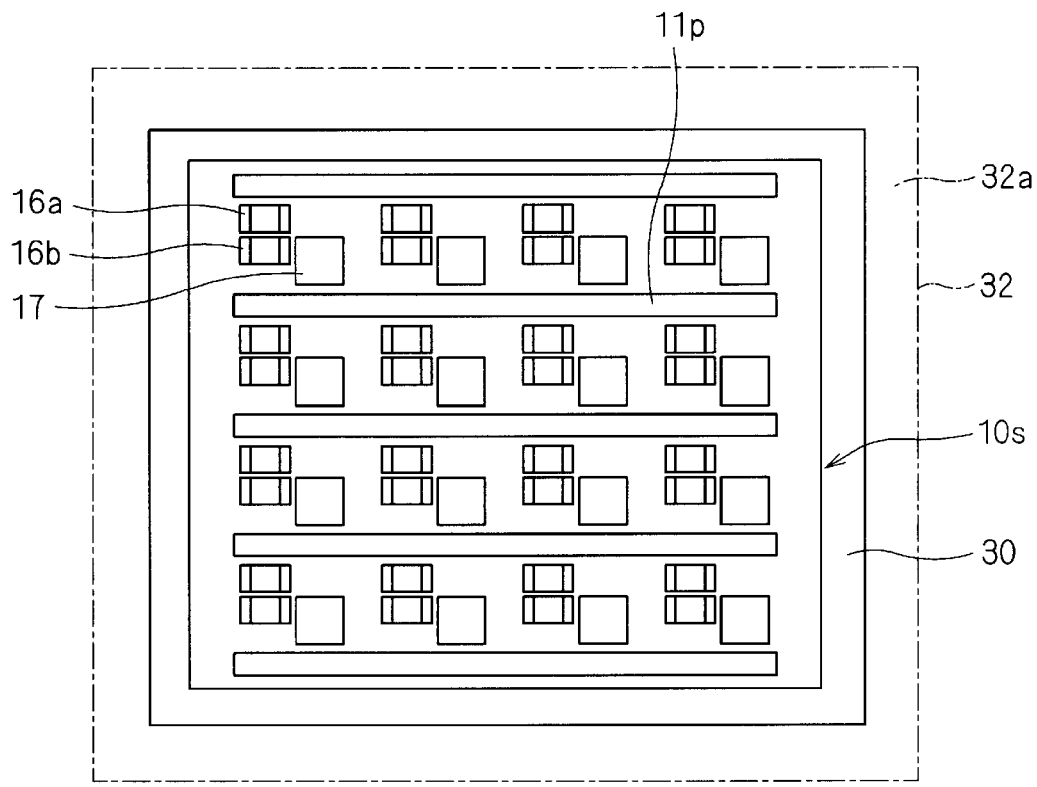
FIG. 7 is a plan view illustrating a manufacturing step for electronic component units according to the second preferred embodiment of the present invention.

Then, as shown in FIG. 7, the components 16a, 16b, and 17 are mounted on individual substrate regions (which will be used as the individual substrates 12) of the aggregate substrate 10s. More specifically, the chip components 16a and 16b are reflow-soldered, while the bump-treated IC chip 17 is flip-chip-mounted. In FIG. 7, solder is not shown. The components 16a, 16b, and 17 can be mounted with reference to the division grooves 11p, that is, portions corresponding to first side surfaces 12q and 12s of the substrate 12.

Figure 8:
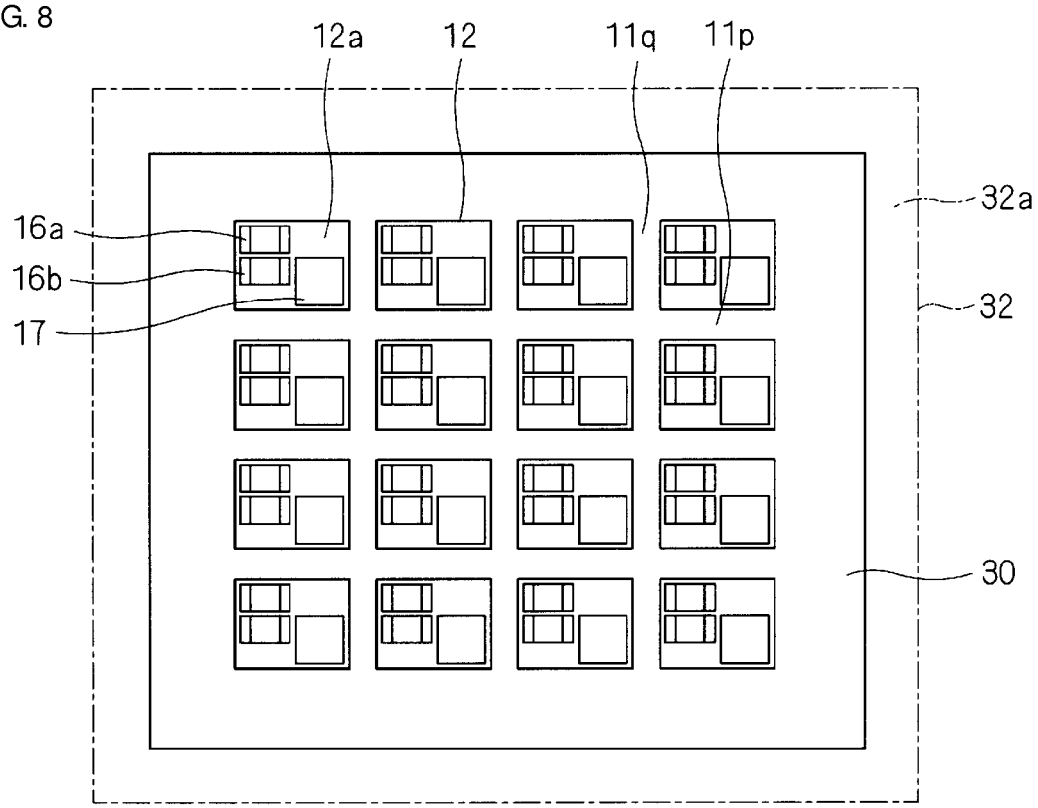
FIG. 8 is a plan view illustrating a manufacturing step for electronic component units according to the second preferred embodiment of the present invention.

Then, as shown in FIG. 8, among the division grooves 11p and 11q arranged in the two directions for dividing the aggregate substrate 10s into individual substrates 12 in a lattice-shaped configuration, the division grooves 11q in the other direction (vertical direction in the drawing) are formed in the temporarily fixed aggregate substrate 10s by dicing processing or laser processing. The division grooves 11q are formed such that they pass through the principal surfaces 10a and 10b of the aggregate substrate 10s. Then, the aggregate substrate 10s can be divided into the individual substrates 12. In FIG. 8, solder is not shown.

If necessary, a resin mold is formed or a casing is attached while the individual substrates 12 remain temporarily fixed. Then, the temporal fixing state of the individual substrates 12 is released, thus making it possible to remove the electronic component units 20.

The division grooves 11p and 11q may be formed such that they do not pass through the principal surfaces 10a and 10b of the aggregate substrate 10s. In this case, for example, a force may be applied along the division grooves 11p and 11q so as to divide the aggregate substrate 10s into the individual substrates 12, thus making it possible to remove the electronic component units 20.

According to the above-described manufacturing method, the electronic component unit 20 shown in FIG. 1 can be manufactured. In this case, among the four side surfaces 12p through 12s of the rectangular substrate 12 of the electronic component unit 20, one pair of opposing side surfaces 12q and 12s are first side surfaces formed prior to the component mounting step, while the other pair of opposing side surfaces 12p and 12r are second side surfaces formed subsequent to the component mounting step.

When forming the division grooves 11q, that is, the second side surfaces 12p, and 12r, after components are mounted, a distance D1 with an extra allowance is required between the second side surface 12p and the components 16a and 16b and a distance D3 with an extra allowance is required between the second side surface 12r and the component 17, by considering the positional precision of the second side surfaces 12p and 12r, that is, a variation in the forming positions of the second side surfaces 12p and 12r. The reason for this is that, for example, it is necessary to ensure that a dicing blade for forming division grooves will not interfere with components.

In contrast, concerning division grooves 11p which have already been formed when mounting components, such an extra allowance is not required for the distances D2 and D4 between the first side surfaces 12q and 12s and the components 16a and 17, respectively.

It is not necessary that the distances D2 and D4 between the first side surfaces 12q and 12s and the components 16a and 17, respectively, be the same as the distances D1 and D3 between the second side surfaces 12p and 12r and the components 16, 17, and 18. Accordingly, the distances D2 and D4 can be suitably selected so as to reduce the size of the electronic component unit 20. That is, by setting the distances D2 and D4 between the first side surfaces 12q and 12s and the components 16a and 17, respectively, to be different from the distances D1 and D3 between the second side surfaces 12p and 12r and the components 16a, 16b, and 17, it is possible to reduce the size of the electronic component unit 20 including the components 16a, 16b, and 17 on the substrate 12.

More specifically, by setting the distances D2 and D4 between the first side surfaces 12q and 12s and the components 16a and 17, respectively, to be smaller than the distances D1 and D4 between the second side surfaces 12p and 12r and the components 16a, 16b, and 17, the size of the electronic component unit 20 can be reduced. For example, the relationships among the distances D1 through D4 may be set to be D2<D1, D4<D3, D1=D3, and D2=D4.

As in the second preferred embodiment, the side surfaces 12q and 12s along the long sides of the rectangular or substantially rectangular principal surface 12a are set to be the first side surfaces, which are formed before components are mounted, and the side surfaces 12p and 12r along the short sides of the rectangular or substantially rectangular principal surface 12a are set to be the second side surfaces, which are formed after components are mounted. With this arrangement, the size of the individual substrates 12 is reduced to be smaller than that when the side surfaces 12q and 12s along the long sides of rectangular or substantially rectangular principal surface 12a are set to be the second side surfaces, which are formed after components are mounted, and the side surfaces 12p and 12r along the short sides of the rectangular or substantially rectangular principal surface 12a are set to be the first side surfaces, which are formed before components are mounted. As a result, the size of the electronic component unit 20 is also reduced.

Third Preferred Embodiment

An electronic component unit 21 according to a third preferred embodiment of the present invention will be described below with reference to FIGS. 9, 10A and 10B.

Figure 10A:
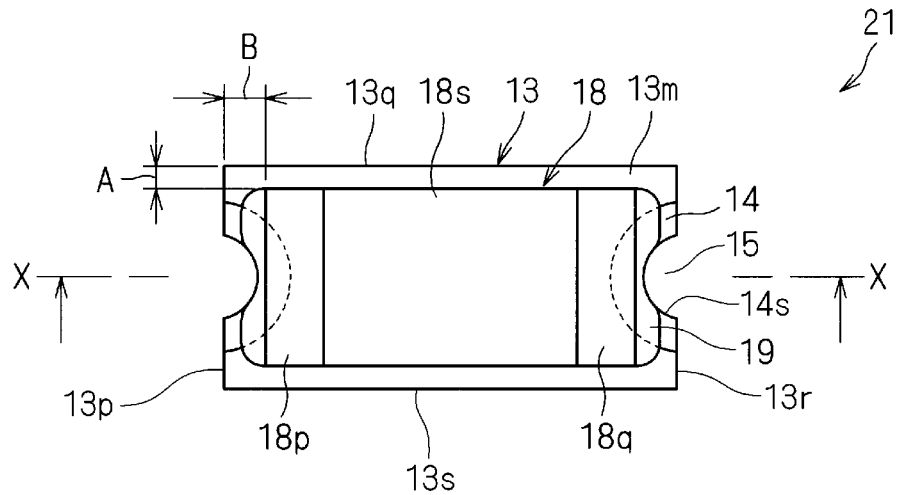
FIGS. 10A and 10B are respectively a plan view and a sectional view of an electronic component unit according to the third preferred embodiment of the present invention.

FIG. 10A is a plan view of the electronic component unit 21. FIG. 10B is a sectional view taken along line X-X of FIG. 10A.

Figure 10B:
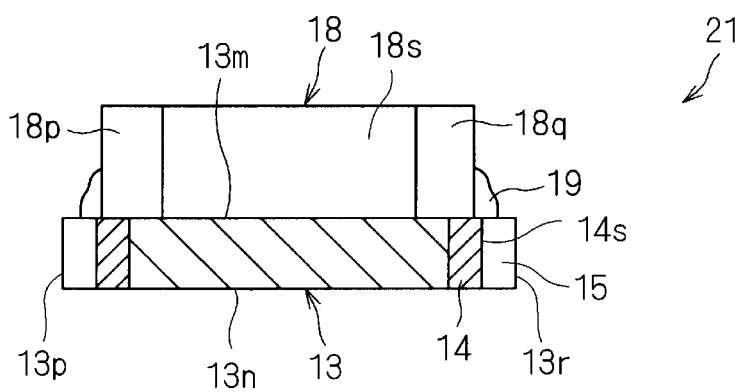

As shown in FIGS. 10A and 10B, the electronic component unit 21 preferably is an interposer capacitor including a multilayer capacitor 18 mounted on an interposer substrate 13. The multilayer capacitor 18 is configured such that electrodes 18p and 18q are provided at both ends of a rectangular body 18s, and is mounted by using a bonding medium 19, such as solder or a conductive paste. The interposer substrate 13 includes a pair of rectangular or substantially rectangular principal surfaces 13m and 13n opposing each other and side surfaces 13p through 13s connecting between the principal surfaces 13m and 13n. The side surfaces 13q and 13s along the long sides of the principal surfaces 13m and 13n are first side surfaces formed prior to the mounting of the multilayer capacitor 18, while the side surfaces 13p and 13r along the short sides of the principal surfaces 13m and 13n are second side surfaces formed subsequent to the mounting of the multilayer capacitor 18.

At both ends of the interposer substrate 13 in the longitudinal direction, terminal electrodes 14 are formed such that they are disposed farther backward than the pair of second side surfaces 13p and 13r and disposed continuously from one principal surface 13m to the other principal surface 13n, and halved-tubular through-hole spaces 15 are formed along inner peripheral surfaces 14s of the terminal electrodes 14. That is, as viewed from a line normal to the principal surfaces 13m and 13n, in the interposer substrate 13, recessed portions farther backward than the pair of second side surfaces 13p and 13r are formed by the inner peripheral surfaces 14s of the terminal electrodes 14, and the through-holes spaces 15 are formed by the recessed portions, that is, the inner peripheral surfaces of the terminal electrodes 14.

The electronic component unit 21 is preferably fabricated as follows by using the same manufacturing method as that in the second preferred embodiment.

First, an aggregate substrate is prepared and temporarily fixed.

Figure 9:
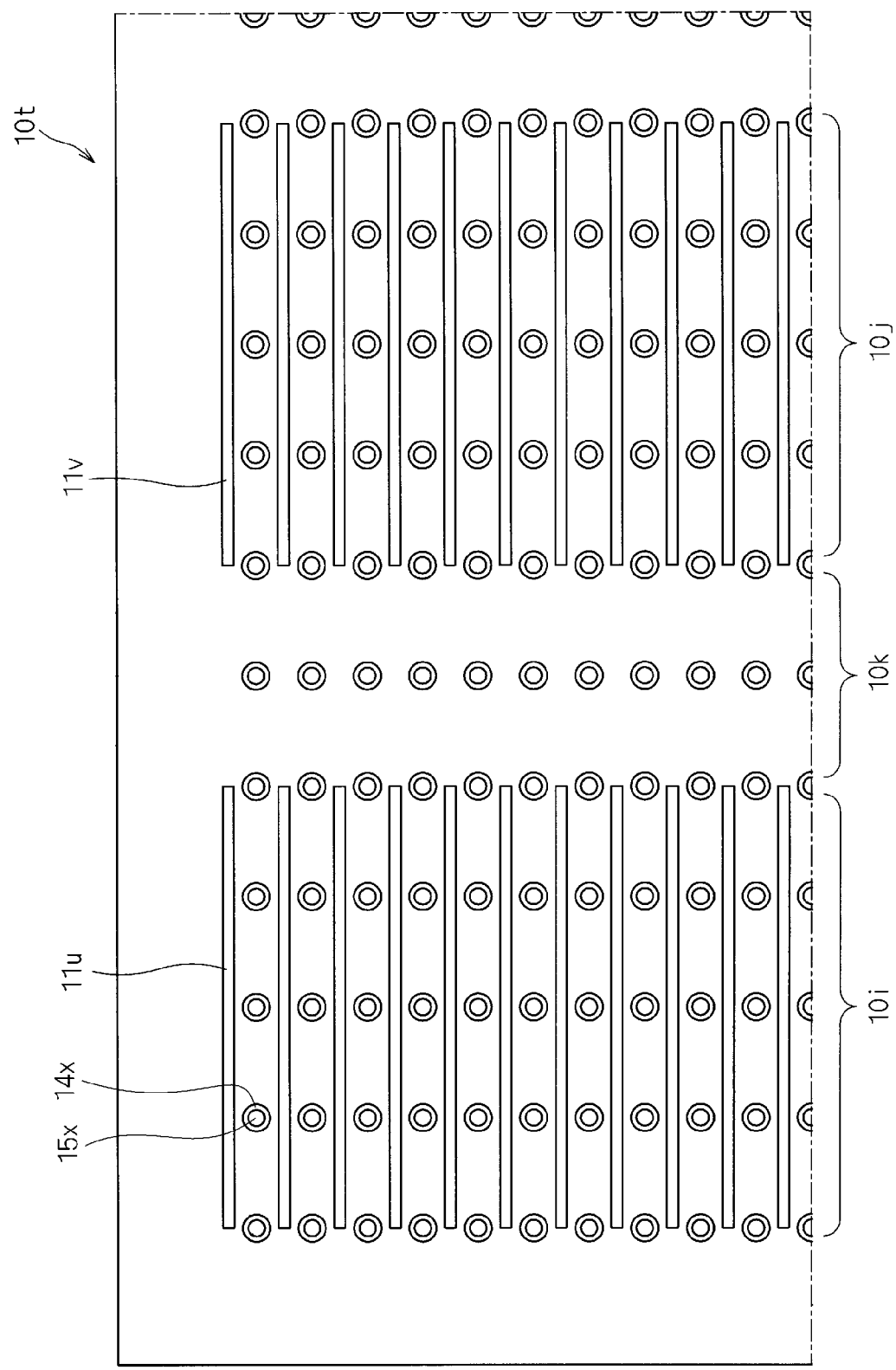
FIG. 9 is a major-part plan view illustrating a manufacturing step for electronic component units according to third and fourth preferred embodiments of the present invention.

As shown in a plan view of FIG. 9, division grooves 10u and 10v in one direction are formed in an aggregate substrate 10t. In the aggregate substrate 10t, portions 14x and 15x, which will be used as the terminal electrodes 14 and the through-hole spaces 15, respectively, when the aggregate substrate 10t is cut, are formed in advance. For example, through-holes are formed in the aggregate substrate 10t, and a conductive paste is applied to and near the inner peripheral surfaces of the through-holes by a method, such as screen printing, thereby forming the portions 14x and 15x, which will be used as the terminal electrodes 14 and the through-hole spaces 15, respectively, in advance.

The division grooves 11u and 11v are intermittently formed. This will be described more specifically. In the aggregate substrate 10t, a third zone 10k is disposed between a first zone 10i including some individual substrate regions and a second zone 10j including other individual substrate regions. The first division grooves 11u are formed in one direction along the boundary lines of the individual substrate regions in the first zone 10i, while the second division grooves 11v are formed in one direction along the boundary lines of the individual substrate regions in the second zone 10j. No division grooves are formed in the third region 10k disposed between the first zone 10i and the second zone 10j. With this arrangement, the first and second division grooves 11u and 11v are disconnected in the third zone 10k.

If the direction of the first division grooves 11u formed along the individual substrate regions in the first zone 10i is the same as the direction of the second division grooves 11v formed along the individual substrate regions in the second zone 10j, the work efficiency for forming division grooves is favorably enhanced. However, division grooves in the first zone 10i and those in the second zone 10j formed before the multilayer capacitor 18 is mounted may be formed in different directions. Additionally, the provision of at least one individual substrate region for each of the first and second zones is sufficient.

By intermittently forming division grooves in an aggregate substrate, the strength of the aggregate substrate is less decreased than that in a case in which division grooves are continuously formed. That is, by forming the division grooves 11u and 11v separately in the first zone 10i and the second zone 10j, respectively, the strength of the aggregate substrate 10t is less decreased than that in a case in which division grooves are formed also in the third zone 10k so as to form common division grooves continuously from the first zone 10i to the second zone 10j via the third zone 10k. This makes it possible to reduce damage to the aggregate substrate 10t on such occasions when redoing the temporal fixing of the aggregate substrate 10t immediately before or after the subsequent component mounting step.

Then, the multilayer capacitor 18 is mounted on the aggregate substrate 10t. In this case, if the multilayer capacitor 18 is mounted with reference to the division grooves 11u and 11v, it is possible to prevent the deviation of the electronic component unit 21 from the center of gravity.

Then, division grooves in a different direction from that of the division grooves 11u and 11v are formed in the aggregate substrate 10t. Then, the aggregate substrate 10t is divided into individual substrates. In this case, the division grooves are formed such that they pass through the centers of the portions 14x and 15x, which will be used as the terminal electrodes 14 and the through-holes 15, respectively.

By releasing the temporal fixing state of the individual substrates, the electronic component units 21 can be removed.

According to the above-described manufacturing method, as shown in FIG. 10A, a distance A between each of the first side surfaces 13q and 13s of the interposer substrate 13 and the multilayer capacitor 18 is reduced to be smaller than a distance B between each of the second side surfaces 13p and 13r of the interposer substrate 13 and the multilayer capacitor 18. As a result, the size of the electronic component unit 21 is reduced.

Fourth Preferred Embodiment

An electronic component unit 21a according to a fourth preferred embodiment of the present invention will be described below with reference to FIG. 11.

The electronic component unit 21a preferably is configured similarly to the electronic component unit 21 of the third preferred embodiment and is fabricated in the same steps and in the same order as the electronic component unit 21 of the third preferred embodiment. A description will be given mainly of points different from the third preferred embodiment, and elements having the same configurations as those of the third preferred embodiment are designated by like reference numerals.

Figure 11:
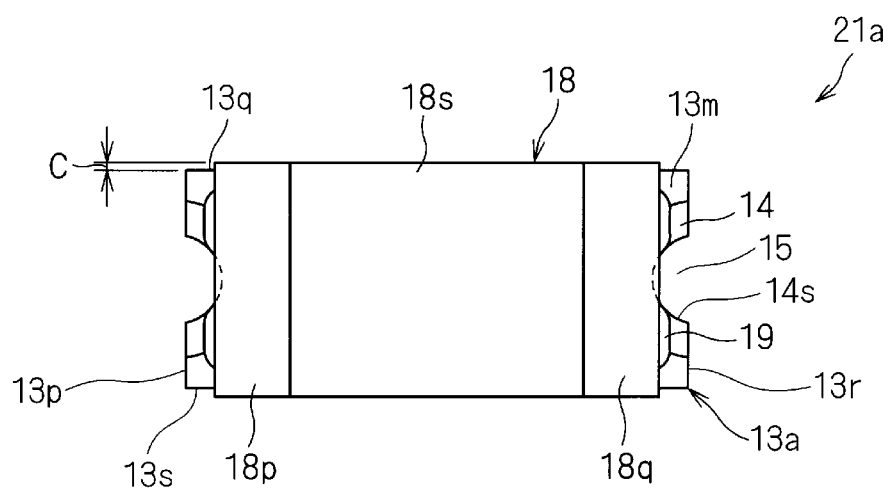
FIG. 11 is a plan view of an electronic component unit according to the fourth preferred embodiment of the present invention.
Figure 12:
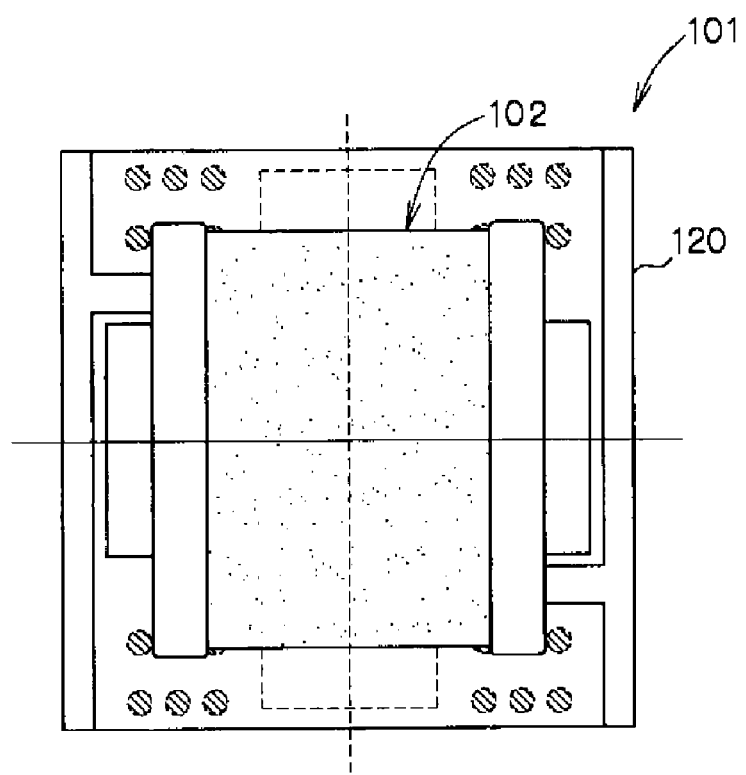
FIG. 12 is a plan view of an electronic component unit according to an example of related art.

FIG. 11 is a plan view of the electronic component unit 21a. As shown in FIG. 11, the multilayer capacitor 18 extends beyond a pair of first side surfaces 13q and 13s of an interposer substrate 13a and extends to outside of both side portions of the interposer substrate 13a.

With this configuration, concerning the direction in which the pair of first side surfaces 13q and 13s oppose each other (vertical direction in the drawing), the dimension of the interposer substrate 13a is reduced to be smaller than the multilayer capacitor 18. It is thus possible to significantly reduce or minimize the dimension of the electronic component unit 21a in the direction in which the pair of first side surfaces 13q and 13s oppose each other.

As shown in FIG. 11, as viewed from a line normal to the principal surfaces 13m and 13n of the interposer substrate 13a, the electrodes 18p and 18q are disposed at both ends of the multilayer capacitor 18 such that they overlap the through-hole spaces 15 defined by the inner peripheral surfaces 14s of the terminal electrodes 14 of the interposer substrate 13a.

With this configuration, the distance of the interposer substrate 13a is reduced in the direction in which the pair of second side surfaces 13p and 13r oppose each other. Accordingly, the distance of the electronic component unit 21a in the longitudinal direction in which the pair of second side surfaces 13p and 13r oppose each other is reduced to be smaller than that of the third preferred embodiment.

In FIG. 11, the multilayer capacitor 18 extends to outside of both side portions of the interposer substrate 13a. However, the multilayer capacitor 18 may extend to outside of one side portion of the interposer substrate 13a. Even in this case, concerning the side of the interposer substrate 13a from which the multilayer capacitor 18 is protruded, the distance of the interposer substrate 13a is reduced, and, as a result, the electronic component unit 21a is also reduced.

As discussed in the first through fourth preferred embodiments, at least some of division grooves are formed in an aggregate substrate first, and then, components are mounted on the aggregate substrate. As a result, it is possible to reduce the size of an electronic component unit including a component mounted on a substrate.

The present invention is not restricted to the above-described preferred embodiments, and may be carried out by making various modifications thereto.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component unit comprising:
an interposer substrate including principal surfaces opposing each other and side surfaces between the principal surfaces; and
only one chip capacitor mounted on one of the principal surfaces of the interposer substrate; wherein
the side surfaces of the interposer substrate include a first side surface formed before the only one chip capacitor is mounted on the substrate and a second side surface formed after the only one chip capacitor is mounted on the interposer substrate;
as viewed from a line normal to the principal surfaces of the interposer substrate, a distance between the first side surface and the only one chip capacitor is different from a distance between the second side surface and the only one chip capacitor; and
as viewed from the line normal to the principal surfaces of the interposer substrate, the only one chip capacitor extends beyond the first side surface and extends to outside of the interposer substrate.

2. The electronic component unit according to claim 1, wherein:
the principal surfaces of the interposer substrate are rectangular or substantially rectangular;
the side surfaces of the interposer substrate include a pair of the first side surfaces opposing each other and a pair of the second side surfaces opposing each other; and
as viewed from the line normal to the principal surfaces of the interposer substrate, the only one chip capacitor extends beyond the pair of first side surfaces and extends to outside of both of the first side surfaces of the interposer substrate.

3. The electronic component unit according to claim 2, wherein, as viewed from the line normal to the principal surfaces of the interposer substrate, recessed portions positioned farther backward than the pair of second side surfaces are provided in the interposer substrate, and the only one chip capacitor overlaps spaces defined by the recessed portions.

4. The electronic component unit according to claim 3, wherein:
the first side surfaces of the interposer substrate extend along long sides of the principal surfaces of the interposer substrate;
the second side surfaces of the interposer substrate extend along short sides of the principal surfaces of the interposer substrate; and
the only one chip capacitor includes a rectangular or substantially rectangular body and electrodes located at both ends of the body, and, as viewed from the line normal to the principal surfaces of the interposer substrate, the electrodes overlap the spaces defined by the recessed portions.

5. The electronic component unit according to claim 1, wherein the electronic component unit is one of a multilayer capacitor and an interposer capacitor.

6. A manufacturing method for an electronic component unit, comprising:
an interposer substrate preparing step of preparing an aggregate interposer substrate including principal surfaces opposing each other and including individual interposer substrate regions to be divided as individual interposer substrates;
a component mounting step of mounting only one chip capacitor on the individual interposer substrate regions of the aggregate interposer substrate; and
an interposer substrate dividing step of dividing the aggregate interposer substrate into the individual interposer substrates by forming division grooves in the aggregate interposer substrate along boundary lines of the individual interposer substrate regions to form an electronic component unit including the only one chip capacitor mounted on the divided individual interposer substrate; wherein
by forming the division grooves in the aggregate interposer substrate along at least one side of each of the individual interposer substrate regions prior to the component mounting step, the interposer substrate dividing step is started prior to the component mounting step; and
in the component mounting step, the only one chip capacitor is mounted on one of the individual interposer substrate regions so that, as viewed from a line normal to the principal surfaces of the interposer substrate, the only one chip capacitor extends beyond the at least one side of each of the individual interposer substrate regions in which the division groove has been formed prior to the component mounting step and extends to outside of the individual interposer substrate region.

7. The manufacturing method for an electronic component unit according to claim 6, wherein
the aggregate interposer substrate includes a first zone including one or some of the individual interposer substrate regions, a second zone including another one or other some of the individual interposer substrate regions, and a third zone disposed between the first zone and the second zone; and the division grooves formed along the boundary lines of the individual interposer substrate regions in the first zone and the division grooves formed along the boundary lines of the individual interposer substrate regions in the second zone are disconnected in the third zone.

8. The manufacturing method for an electronic component unit according to claim 6, wherein prior to the component mounting step, the division grooves extending through the principal surfaces of the aggregate interposer substrate are formed along all of the boundary lines of the individual interposer substrate regions while the aggregate interposer substrate is being temporarily fixed so as to divide the aggregate interposer substrate into the individual interposer substrates which are being temporarily fixed to complete the interposer substrate dividing step prior to the component mounting step; and in the component mounting step, the only one chip capacitor is mounted on the individual interposer substrates which are being temporarily fixed.

9. The manufacturing method for an electronic component unit according to claim 8, further comprising forming a resin mold or attaching a casing to the individual interposer substrates while the individual interposer substrates are being temporarily fixed.

10. The manufacturing method for an electronic component unit according to claim 6, wherein the division grooves are formed in a lattice-shaped configuration.

11. The manufacturing method for an electronic component unit according to claim 6, wherein the interposer substrate dividing step is completed prior to the component mounting step.

12. The manufacturing method for an electronic component unit according to claim 6, wherein the division grooves are formed so as not to pass through the principal surfaces.

13. The manufacturing method for an electronic component unit according to claim 6, wherein the electronic component unit is one of a multilayer capacitor and an interposer capacitor.

14. An electronic component unit comprising:

an interposer substrate including principal surfaces opposing each other and side surfaces between the principal surfaces; and only one chip capacitor mounted on one of the principal surfaces of the interposer substrate; wherein the side surfaces of the interposer substrate include a first side surface formed before the only one chip capacitor is mounted; and as viewed from a line normal to the principal surfaces of the interposer substrate, the only one chip capacitor extends beyond the first side surface and extends to outside of the interposer substrate.

15. The electronic component unit according to claim 14, wherein:

the principal surfaces of the interposer substrate are rectangular or substantially rectangular;

the side surfaces of the interposer substrate include a pair of the first side surfaces opposing each other; and as viewed from the line normal to the principal surfaces of the interposer substrate, the only one chip capacitor extends beyond the pair of first side surfaces and extends to outside of both of the first side surfaces of the interposer substrate.

16. The electronic component unit according to claim 15, wherein:

the side surfaces of the interposer substrate include a pair of the second side surfaces opposing each other; and as viewed from the line normal to the principal surfaces of the interposer substrate, recessed portions positioned farther backward than the pair of second side surfaces are provided in the interposer substrate, and the only one chip capacitor overlaps spaces defined by the recessed portions.

\* \* \* \* \*